United States Patent
Wang

(10) Patent No.: US 7,041,531 B2
(45) Date of Patent: May 9, 2006

(54) METHOD OF FABRICATING FLIP CHIP BALL GRID ARRAY PACKAGE

(75) Inventor: Meng-Jen Wang, Pingtung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/710,582

(22) Filed: Jul. 22, 2004

(65) Prior Publication Data

US 2005/0019981 A1   Jan. 27, 2005

(30) Foreign Application Priority Data

Jul. 22, 2003   (TW) ................ 92119938 A

(51) Int. Cl.
*H01L 21/44* (2006.01)

(52) U.S. Cl. ................... 438/106; 438/108

(58) Field of Classification Search ........ 438/106–114, 438/15, 25–26, 55, 64, 118, 128, 149, 152, 438/155, 164, 166, 455, 458–459, 597–599, 438/602–606, 608, 618, 621, 628, 644, 654, 438/667, 761, 660–663, 795–796, 977, 798

See application file for complete search history.

(56) References Cited

U.S. PATENT DOCUMENTS

| | | | | |
|---|---|---|---|---|
| 6,031,284 A * | 2/2000 | Song | ................ | 257/701 |
| 6,548,330 B1 * | 4/2003 | Murayama et al. | ......... | 438/127 |
| 6,570,469 B1 * | 5/2003 | Yamada et al. | ............. | 333/193 |
| 6,686,223 B1 * | 2/2004 | Uchida | ............. | 438/108 |
| 6,696,764 B1 * | 2/2004 | Honda | ............ | 257/778 |

\* cited by examiner

*Primary Examiner*—Michael Lebentritt
*Assistant Examiner*—Andre' C. Stevenson, Sr.
(74) *Attorney, Agent, or Firm*—Jianq Chyun IP Office

(57) ABSTRACT

A method of fabricating a flip chip ball grid array (FC-BGA) package is provided. First, a substrate including a first surface and a second surface is provided, wherein the first surface includes a plurality of cavities. Then, a plurality of flip chips is adhered in the cavities of the substrate. Thereafter, an underfill filling step is performed to fill an underfill between the substrate the flip chips. Then, a ball placement step is performed to attach a plurality of solder balls to a second surface of the substrate. Thereafter, the substrate is divided to separate a portion of the substrate adhering to the flip chips from a sidewall of the cavities.

3 Claims, 6 Drawing Sheets

_US 7,041,531 B2_

1

METHOD OF FABRICATING FLIP CHIP BALL GRID ARRAY PACKAGE

CROSS REFERENCE TO RELATED APPLICATIONS

This application claims the priority benefit of Taiwan application serial no. 92119938, filed Jul. 22, 2003.

BACKGROUND OF INVENTION

1. Field of the Invention

The present invention relates to a method of fabricating a flip chip ball grid array (FC-BGA) package. More particularly, the present invention relates to a method of fabricating a slim flip chip ball grid array (FC-BGA) package.

2. Description of Related Art

Conventionally, a ball grid array (BGA) package structure generally includes chip, substrate and solder balls. The chip is electrically connected to the solder ball via the substrate, wherein the solder ball is provided for external connection. In other words, input/output contacts (binding pads) with a narrower interval inside the chip may be electrically connected to the solder balls with a wider interval via a circuit of the substrate (e.g., a printed circuit board, PCB). Therefore, the solder balls are used for electrically connecting with external circuit.

In general, a flip chip ball grid array (FC-BGA) package represents a ball grid array (BGA) package incorporated with a flip chip package.

FIG. 1 illustrates a side cross-sectional view of a conventional flip chip ball grid array (FC-BGA) package structure.

FIG. 2 illustrates a schematic top view of the flip chip ball grid array (FC-BGA) package structure shown in FIG. 1. Referring to FIG. 1, a conventional packaging method of a flip chip ball grid array (FC-BGA) package is described. First, a plurality of flip chips 100 is attached on one side of a substrate 102. Next, a plurality of solder balls 104 is formed on another side of the substrate 102 (conventionally, this procedure is called "ball replacement"). Thereafter, an underfill 106 is filled between the substrates and the flip chips. Next, the substrate is divided into a plurality of sub-substrates with respect to the corresponding flip chip(s) (conventionally, this procedure is called "singulation"). Thus, a plurality of flip chip ball grid array (FC-BGA) package structure 150 as illustrated in FIG. 7B is formed.

Referring to FIG. 2, a plurality of dividers 108 used for separating every package structures 150 is formed between every flip chips 100.

It is noted that, the conventional package method described above has the disadvantages that the packaging structure after singulation has a thicker thickness due to the substrate includes a core layer.

SUMMARY OF INVENTION

Therefore, the present invention is directed to a method of fabricating a flip chip ball grid array (FC-BGA) package for reducing the thickness of the packaging structure.

In accordance with one embodiment of the present invention, a method of fabricating a flip chip ball grid array (FC-BGA) package is provided. First, a substrate including a first surface and a second surface is provided, wherein the first surface includes a plurality of cavities. Next, a plurality of flip chips is adhered in the cavities of the substrate. Thereafter, an underfill filling step is performed to fill an underfill between the substrate the flip chips. Next, a ball placement step is performed to connect a plurality of solder balls to a second surface of the substrate. Thereafter, the substrate is divided to separate a portion of the substrate adhering to the flip chips from a sidewall of the cavities.

In one embodiment of the present invention, a sealing glue material is filled into the cavities to cover the flip chips after the underfill filling step and before the ball placement step.

In one embodiment of the present invention, the method of forming the substrate comprises first, a substrate core layer is provided. Next, a circuit layer is formed over the substrate core layer covering the substrate core layer. Thereafter, a plurality of openings is formed in the substrate core layer to expose the circuit layer.

Accordingly, a portion of the substrate core layer is removed for adhering the flip chip. The remaining portions of substrate core layer can be adopted for supporting the substrate to prevent from warpage, and to protect the chip from cracking due to the warpage of the substrate. The removal of a portion of the substrate core layer can reduce the total thickness of each FC-BGA package structure. Thus, the thickness of the FC-BGA package structure is reduced and the structural strength of the FC-BGA package structure is maintained.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
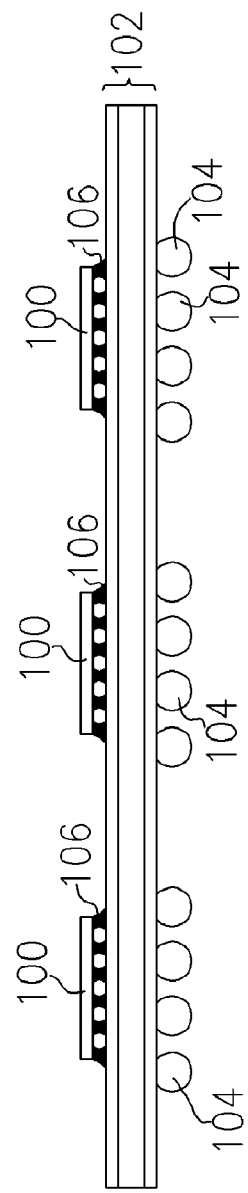
FIG. 1 illustrates a side cross-sectional view of a conventional flip chip ball grid array (FC-BGA) package structure.
Figure 2:
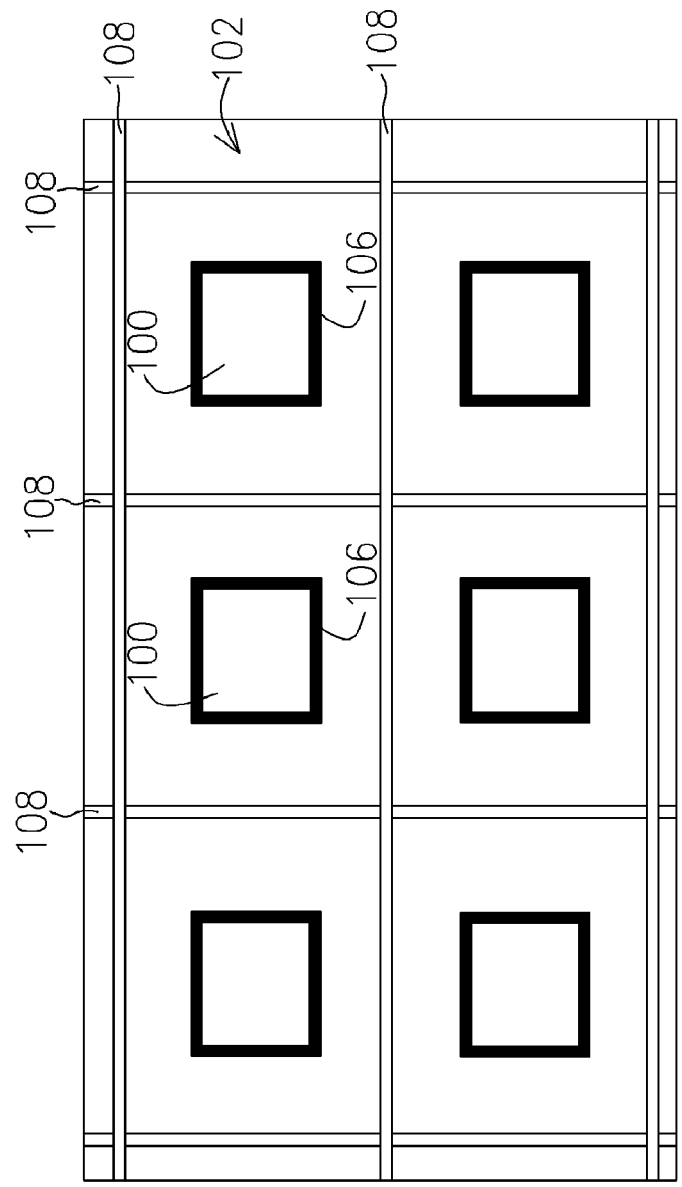
FIG. 2 is a schematic top view of the conventional flip chip ball grid array (FC-BGA) package structure shown in FIG. 1.
Figure 3:
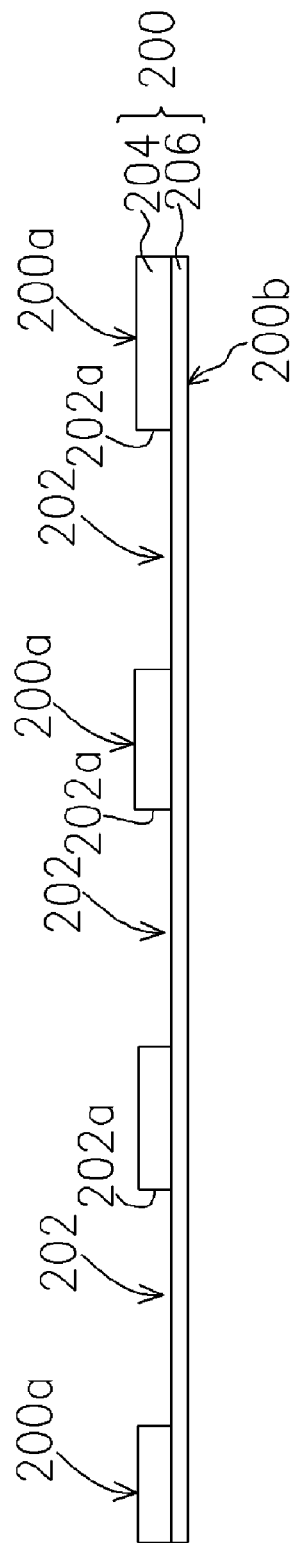
FIGS. 3 to FIG. 6 are side cross-sectional views illustrating progressive steps of a method of fabricating a flip chip ball grid array (FC-BGA) package according to one embodiment of the present invention.

FIG. 3 to FIG. 6 are side cross-sectional views illustrating progressive steps of a method of fabricating a flip chip ball grid array (FC-BGA) package according to one embodiment of the present invention. Referring to FIG. 3, first, a substrate 200 including a first surface 200a and a second surface 200b is provided, wherein the first surface 200a includes a plurality of cavities 202. The reference number 202a represents a sidewall of the cavity 202.

In one embodiment of the present invention, the substrate 200 may be formed by, for example but not limited to, the following method. First, a substrate core layer 204 is provided. Then, a circuit layer 206 is formed over the substrate core layer 204. The circuit layer 206 includes, for example but not limited to, a multiplayer structure comprising dielectric layers (not shown) and conductive layers (not shown), wherein a dielectric layer is disposed between two conductive layers. The conductive layers include, for example but not limited to, copper (Cu) layer. The conductive layer may be formed by, for example but not limited, performing a laminating method or a building up method to form a copper (Cu) layer. The dielectric layer may be formed by, for example but not limited, a coating method. Thereafter, an etching is performed to etch the substrate core layer 204 to form a plurality of openings for exposing portions of circuit layer 206. Referring to FIG. 3, the substrate core layer 204 formed over the circuit layer 206 includes a plurality of cavities 202 exposing portions of circuit layer 206.

Figure 4:
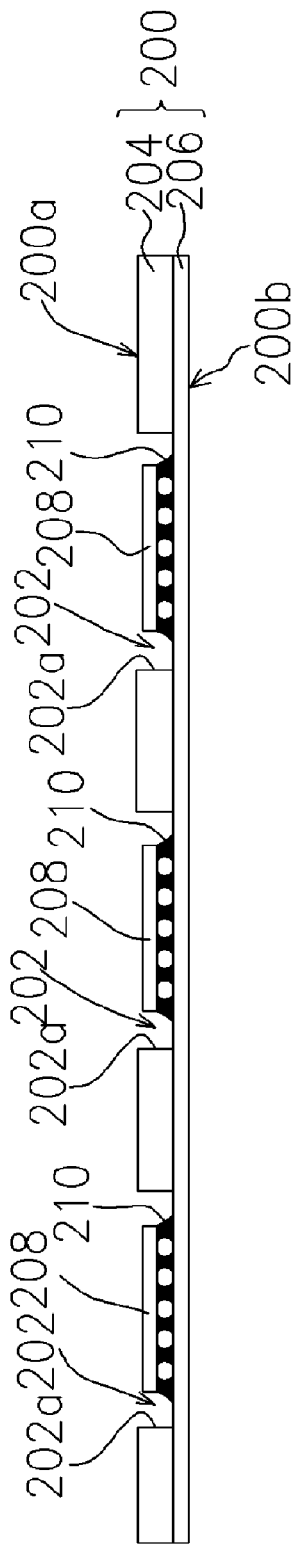

Referring to FIG. 4, a plurality of flip chips 208 is adhered on the circuit layer 206 through the cavities 202. Next, an underfill filling step is carried out to fill an underfill 210 between the substrate 200 and the flip chips 208.

Figure 5:
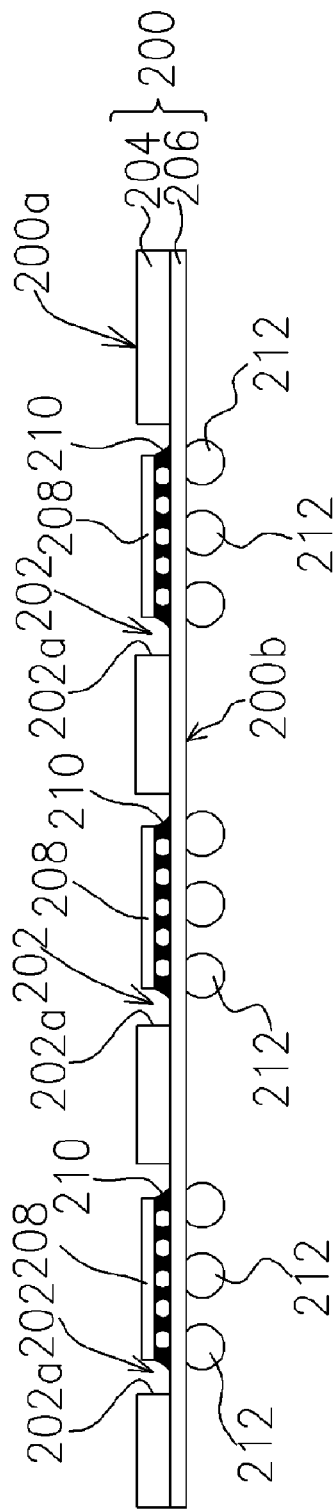

Referring to FIG. 5, a ball placement step is carried out to attach a plurality of solder balls 212 on the circuit layer 206 at the second surface 200b of the substrate 200.

Figure 6:
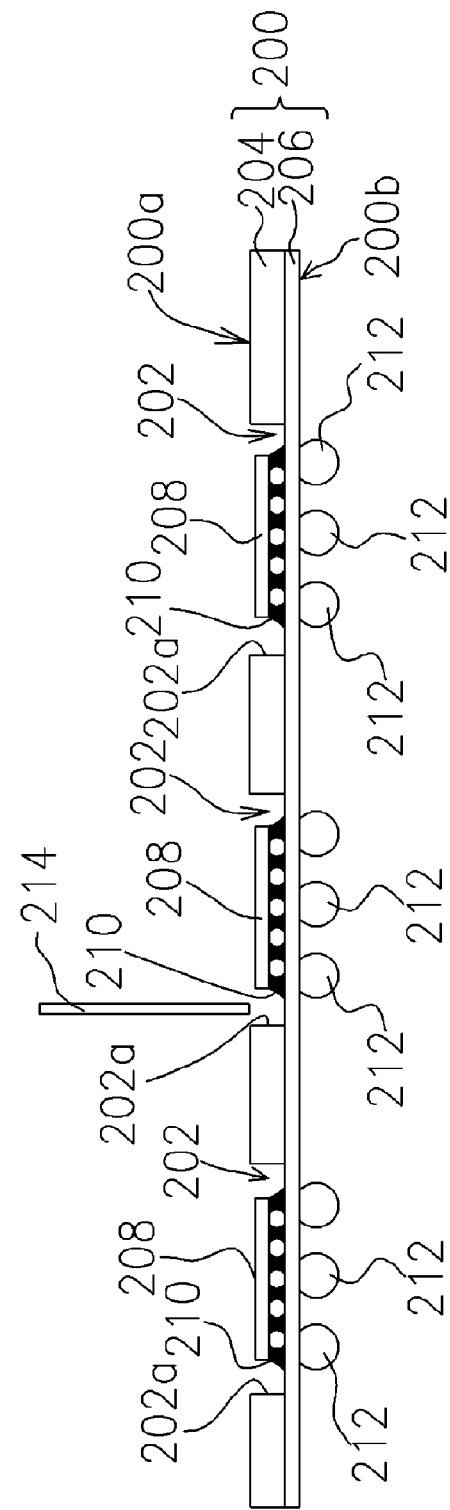
Figures 7A, 7B:
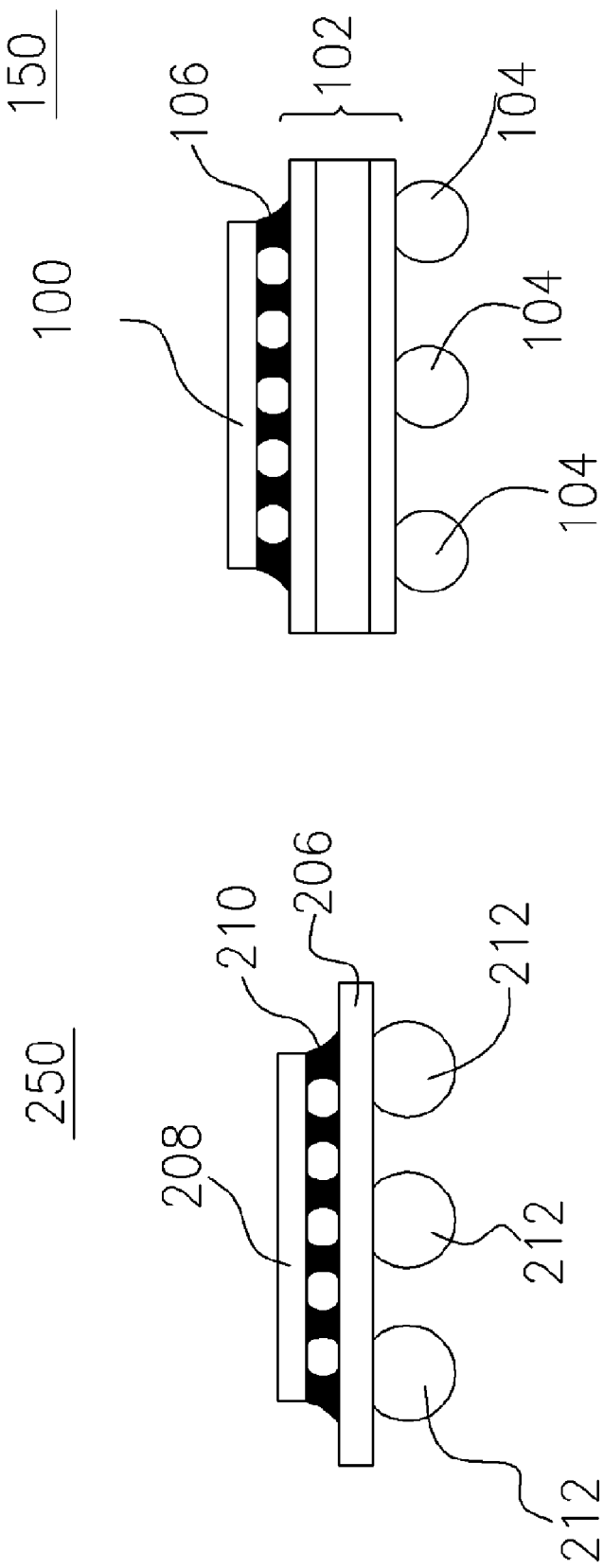
FIG. 7A illustrates a flip chip ball grid array (FC-BGA) package structure according to one embodiment of the present invention.
FIG. 7B illustrates a conventional flip chip ball grid array (FC-BGA) package structure.
Figure 8:
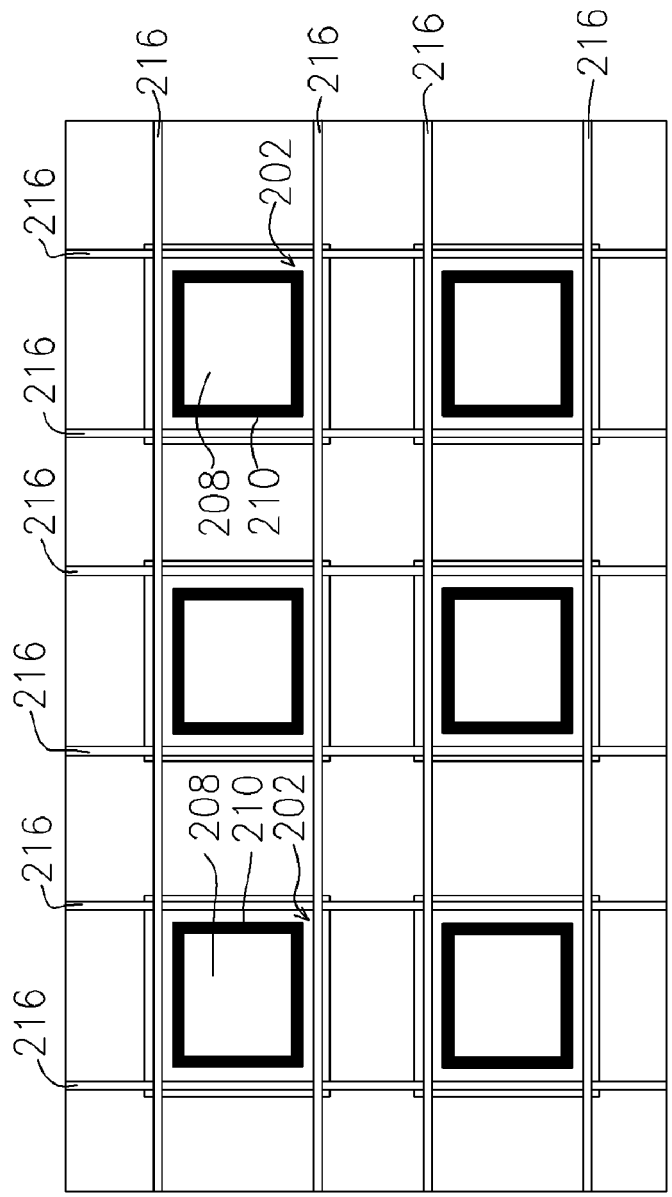
FIG. 8 is a schematic top view of the conventional flip chip ball grid array (FC-BGA) package structure shown in FIG. 6.

Referring to FIG. 6, the substrate 200 is divided by, for example but not limited to, using a circular chip saw 214. Therefore, a portion of the substrate 200 adhering to the flip chips 208 is separated from sidewalls 202a of the cavities 202. Thus, a plurality of flip chip ball grid array (FC-BGA) package structures 250 (as illustrated in FIG. 7A) is formed. FIG. 8 is a schematic top view of the flip chip ball grid array (FC-BGA) package structure shown in FIG. 6, wherein the dividers 216 performed to separate every FC-BGA package structures 250 are illustrated in FIG. 8.

FIG. 7A illustrates a flip chip ball grid array (FC-BGA) package structure 250 according to one embodiment of the present invention, and FIG. 7B illustrates a conventional flip chip ball grid array (FC-BGA) package structure 150. Compared to the FC-BGA packaging structure 150 illustrated in FIG. 7B fabricated by the conventional technology, the FC-BGA packaging structure 250 illustrated in FIG. 7A fabricated by the packaging method of the present invention is more thinner as the substrate core layer 204 is processed by an etching step. In general, if a thickness of the conventional substrate core layer is, for example, about 150 μm, then it is considered to be thinner than that of the conventional package structure.

In a conventional FC-BGA package structure, in general, the thickness of the wafer is processed to be about 8 micro-inches (substantially about 200 μm). The thickness of the underfill is about 90 μm. If a substrate core layer having two copper (Cu) layers and the solder balls are adopted (having a total thickness about 300 μm), Finally, the total thickness of the conventional FC-BGA package structure is about 650 μm. Therefore, in the present embodiment of the invention, the thickness of the FC-BGA package structure can be reduced to about 150 μm, and therefore highly desirable and practicable.

In the embodiment described above, the flip chips of the substrate is packaged as a plurality of dies. In other words, only the underfill is filled between the flip chips and the substrate, however, the flip chips are not packaged by a sealing glue material. It should be noted that, in another embodiment of the present invention, a glue sealing step may also be performed to cover the flip chips.

Figure 9:
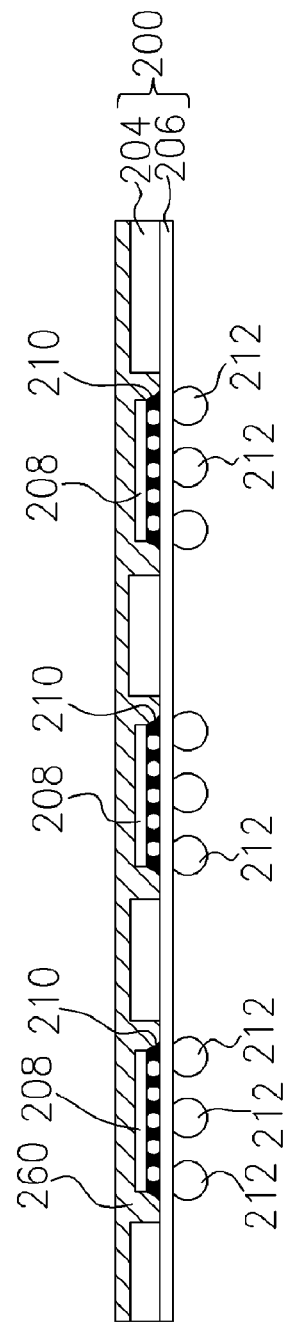
FIG. 9 and FIG. 10 are side cross-sectional views illustrating the progressive steps of a method of fabricating a flip chip ball grid array (FC-BGA) package according to one embodiment of the present invention.
Figure 10:
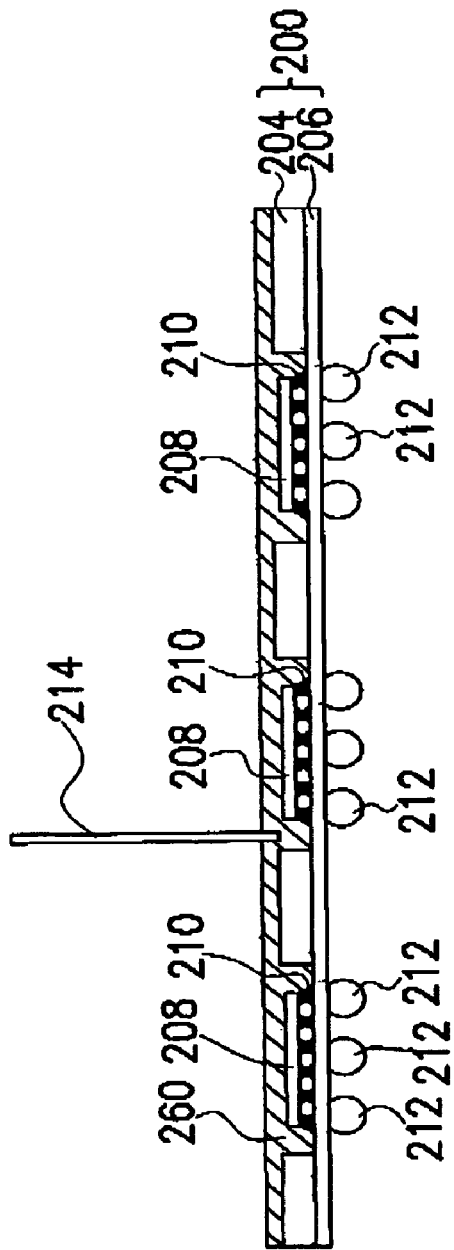

FIG. 9 and FIG. 10 are side cross-sectional views showing progressive steps of a method of fabricating a flip chip ball grid array (FC-BGA) package according to one embodiment of the present invention. Referring to FIG. 9, a sealing glue step is carried out to fill a sealing glue material 260 in the cavities to cover the flip chips 208. In the present embodiment, the components similar to or same as the embodiment described above is represented by the same reference number, therefore, the description thereof is omitted.

The packaging method of the present embodiment is similar to or same as the embodiment illustrated in FIG. 3 and FIG. 4, and thus will not be repeated.

Figure 11:
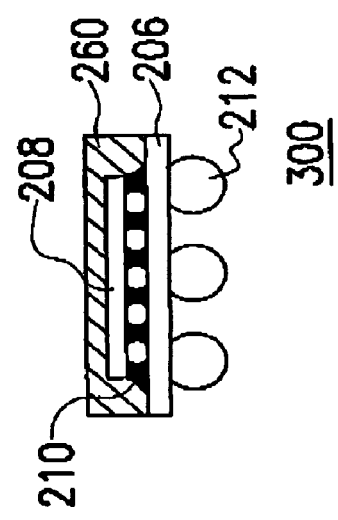
FIG. 11 illustrates a flip chip ball grid array (FC-BGA) package structure according to one embodiment of the present invention.

Thereafter, referring to FIG. 10, the substrate 200 may be divided by, for example but not limited to, using a circular chip saw 214. Therefore, a portion of the substrate 200 adhering to the flip chips 208 is separated from a sidewall 202a of the cavities 202. Thus, referring to FIG. 11, a plurality of FC-BGA package structures 300 are formed.

It should be noted that, in the embodiments described above, although only one flip chip is adhered in one cavity, however, more than one flip chips may also be adhered in one cavity (not shown).

Accordingly, in the manufacturing method of a FC-BGA package of the present invention, a portion of the substrate core layer for adhering the flip chip is removed. Therefore, remaining portions of the substrate core layer can be adopted for supporting the substrate to prevent from warpage, and to protect the chip from cracking due to the warpage of the substrate. By removing a portion of the substrate core layer, the total thickness of each FC-BGA package structure can be reduced. Therefore, the thickness of the FC-BGA package structure is reduced and the structure strength of the FC-BGA package structure is maintained.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

The invention claimed is:

1. A method of fabricating a flip chip ball grid array (FC-BGA) package, comprising:

provifing a substrate having a first circuit surface, a second circuit surface, and a substrate core layer with plurality of openings, wherein the substrate core layer is disposed on the first circuit surface of the substrate;

adhering a plurality of flip chips to the first circuit surface of the substrate through the openings of the substrate core layer;

performing a ball placement step for attaching a plurality of solder balls to the second circuit surface; and singulating the substrate for separating portions of the substrate having the flip chips adhered thereon, wherein the substrate core layer of the substrate is also removed away due to singulating the substrate.

2. The method of claim 1, further comprising a glue sealing step for filling a sealing glue material into the openings to cover the flip chips.

3. The method of claim 1, the step of adhering the flip chips to the first circuit surface of the substrate further comprising filling an underfill material between the substrate and the flip chips.

* * * * *